(12) United States Patent
Hu et al.

(10) Patent No.: US 10,985,085 B2
(45) Date of Patent: Apr. 20, 2021

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Ian Hu, Kaohsiung (TW); Chih-Pin Hung, Kaohsiung (TW); Meng-Kai Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/413,467

(22) Filed: May 15, 2019

(65) Prior Publication Data
US 2020/0365485 A1 Nov. 19, 2020

(51) Int. Cl.
*H01L 23/427* (2006.01)
*H01L 25/065* (2006.01)
*H01L 23/367* (2006.01)
*F28D 15/04* (2006.01)

(52) U.S. Cl.
CPC ......... *H01L 23/427* (2013.01); *F28D 15/046* (2013.01); *H01L 23/3672* (2013.01); *H01L 25/0657* (2013.01); *H01L 2225/06513* (2013.01); *H01L 2225/06582* (2013.01); *H01L 2225/06589* (2013.01)

(58) Field of Classification Search
CPC ..... H01L 23/42; H01L 23/427; H01L 23/367; H01L 23/3675; H01L 23/46; H01L 23/467; H01L 23/473
See application file for complete search history.

(56) References Cited

U.S. PATENT DOCUMENTS

| 3,673,306 | A | * | 6/1972 | Kirkpatrick | F28D 15/0266 174/16.3 |
| 4,012,770 | A | * | 3/1977 | Pravda | H01L 23/367 257/715 |
| 4,188,996 | A | * | 2/1980 | Pellant | F28F 13/12 165/80.4 |
| 4,880,053 | A | * | 11/1989 | Sheyman | H01L 23/427 165/104.26 |
| 5,529,115 | A | * | 6/1996 | Paterson | F28D 15/02 165/104.21 |
| 5,694,295 | A | * | 12/1997 | Mochizuki | F28D 15/0233 361/699 |
| 5,780,928 | A | * | 7/1998 | Rostoker | H01L 23/427 257/713 |

(Continued)

*Primary Examiner* — Scott B Geyer
(74) *Attorney, Agent, or Firm* — Foley & Lardner LLP

(57) ABSTRACT

A thermal conductive device includes a first conductive plate, a second conductive plate, a plurality of wicks and a fluid. The first conductive plate has a first portion adjacent to edges of the first conductive plate and a second portion far away from the edges. The second conductive plate has a first portion adjacent to edges of the first conductive plate and a second portion far away from the edges. The first portion and the second portion of the first conductive plate are respectively connected to the first portion and the second portion of the second conductive plate to define a chamber. The plurality of wicks are disposed within the chamber. The fluid is disposed within the chamber.

25 Claims, 8 Drawing Sheets

(56) References Cited

U.S. PATENT DOCUMENTS

| | | | | |
|---|---|---|---|---|
| 5,880,524 A * | 3/1999 | Xie | H01L 23/427 | 257/704 |
| 6,085,831 A * | 7/2000 | DiGiacomo | F28D 15/0233 | 165/104.26 |
| 6,466,442 B2 * | 10/2002 | Lin | F28D 15/02 | 165/104.33 |
| 6,698,502 B1 * | 3/2004 | Lee | F28D 15/0266 | 165/104.26 |
| 6,986,384 B2 * | 1/2006 | Wagner | F28D 15/0233 | 165/104.21 |
| 7,342,306 B2 * | 3/2008 | Colbert | H01L 23/3672 | 257/712 |
| 7,886,809 B2 * | 2/2011 | Searls | C09K 5/063 | 165/80.3 |
| 8,953,317 B2 * | 2/2015 | Campbell | H05K 7/203 | 165/104.33 |
| 9,960,150 B2 * | 5/2018 | Bitz | H01L 23/4334 | |
| 2002/0056908 A1 * | 5/2002 | Brownell | H05K 1/0209 | 257/714 |
| 2004/0041255 A1 * | 3/2004 | Lindgren | H01L 23/367 | 257/706 |
| 2005/0022975 A1 * | 2/2005 | Rosenfeld | B22F 3/1103 | 165/104.11 |
| 2005/0022984 A1 * | 2/2005 | Rosenfeld | F28D 15/046 | 165/260 |
| 2005/0139995 A1 * | 6/2005 | Sarraf | F28D 15/02 | 257/706 |
| 2006/0039111 A1 * | 2/2006 | Huang | H01L 23/427 | 361/698 |
| 2007/0056714 A1 * | 3/2007 | Wong | F28D 15/046 | 165/104.26 |
| 2008/0264611 A1 * | 10/2008 | Chang | H01L 23/427 | 165/104.26 |
| 2008/0283222 A1 * | 11/2008 | Chang | H01L 23/427 | 165/104.26 |
| 2009/0025910 A1 * | 1/2009 | Hoffman | H01L 23/427 | 165/104.26 |
| 2009/0151906 A1 * | 6/2009 | Lai | H01L 23/427 | 165/104.26 |
| 2010/0006268 A1 * | 1/2010 | Meyer, IV | H01L 23/427 | 165/104.26 |
| 2011/0024892 A1 * | 2/2011 | Lin | H01L 23/427 | 257/690 |
| 2011/0083835 A1 * | 4/2011 | Chen | H01L 23/427 | 165/185 |
| 2012/0012804 A1 * | 1/2012 | Chen | H01L 23/427 | 257/2 |
| 2012/0312506 A1 * | 12/2012 | Uchida | F28D 15/046 | 165/104.21 |
| 2014/0071628 A1 * | 3/2014 | Brunschwiler | H01L 23/367 | 361/700 |
| 2014/0247556 A1 * | 9/2014 | Eid | H01L 23/3675 | 361/700 |
| 2014/0268572 A1 * | 9/2014 | Ranjan | H01L 23/427 | 361/700 |
| 2016/0343639 A1 * | 11/2016 | Groothuis | H01L 23/3675 | |
| 2018/0010861 A1 * | 1/2018 | Wakaoka | H01L 23/427 | |
| 2018/0073814 A1 * | 3/2018 | Zhou | F28D 15/04 | |
| 2018/0358278 A1 * | 12/2018 | Ghioni | F28D 15/025 | |
| 2019/0029106 A1 * | 1/2019 | Lin | C25D 3/38 | |
| 2019/0035713 A1 * | 1/2019 | Prajapati | H05K 7/20318 | |
| 2019/0218667 A1 * | 7/2019 | Mizoguchi | C23F 1/00 | |
| 2019/0219219 A1 * | 7/2019 | Inagaki | F28D 15/0275 | |
| 2019/0348345 A1 * | 11/2019 | Parida | F28D 15/0233 | |
| 2019/0391625 A1 * | 12/2019 | Enright | H05K 7/20381 | |

* cited by examiner

SEMICONDUCTOR DEVICE PACKAGE AND METHOD FOR MANUFACTURING THE SAME

BACKGROUND

1. Technical Field

The present disclosure relates to a semiconductor device package, and to a semiconductor device package including a heat dissipation structure.

2. Description of the Related Art

The semiconductor industry has seen growth in an integration density of a variety of electronic components in some semiconductor device packages. This increased integration density often corresponds to an increased power density in the semiconductor device packages. As the power density of semiconductor device packages grows, heat dissipation can become desirable, in some implementations. Thus, it can be useful in some implementations to provide a semiconductor device package with improved thermal conductivity.

SUMMARY

In some embodiments, a thermal conductive device includes a first conductive plate, a second conductive plate, a plurality of wicks and a fluid. The first conductive plate has a first portion adjacent to edges of the first conductive plate and a second portion far away from the edges. The second conductive plate has a first portion adjacent to edges of the first conductive plate and a second portion far away from the edges. The first portion and the second portion of the first conductive plate are respectively connected to the first portion and the second portion of the second conductive plate to define a chamber. The plurality of wicks are disposed within the chamber. The fluid is disposed within the chamber.

In some embodiments, a semiconductor device package includes a carrier, a first electronic component and a thermal conductive device. The first electronic component is disposed on the carrier. The first electronic component has an active surface facing the carrier and a back surface opposite to the active surface. The thermal conductive device has a first joint surface disposed on the back surface of the first electronic component and a chamber disposed on the carrier and surrounding the first electronic component. The thermal conductive device comprises a plurality of wicks disposed within the chamber and a fluid disposed within the chamber.

In some embodiments, a semiconductor device package includes a carrier, an electronic component and a thermal conductive device. The electronic component is disposed on the carrier. The first electronic component has an active surface facing the carrier and a back surface opposite to the active surface. The thermal conductive device has a first joint surface disposed on the back surface of the electronic component and a chamber disposed on the carrier and surrounding the electronic component. The thermal conductive device includes a plurality of wicks disposed within the chamber and a fluid disposed within the chamber. In the case that the electronic component is configured to operate, at least a portion of the fluid vaporizes into gas.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
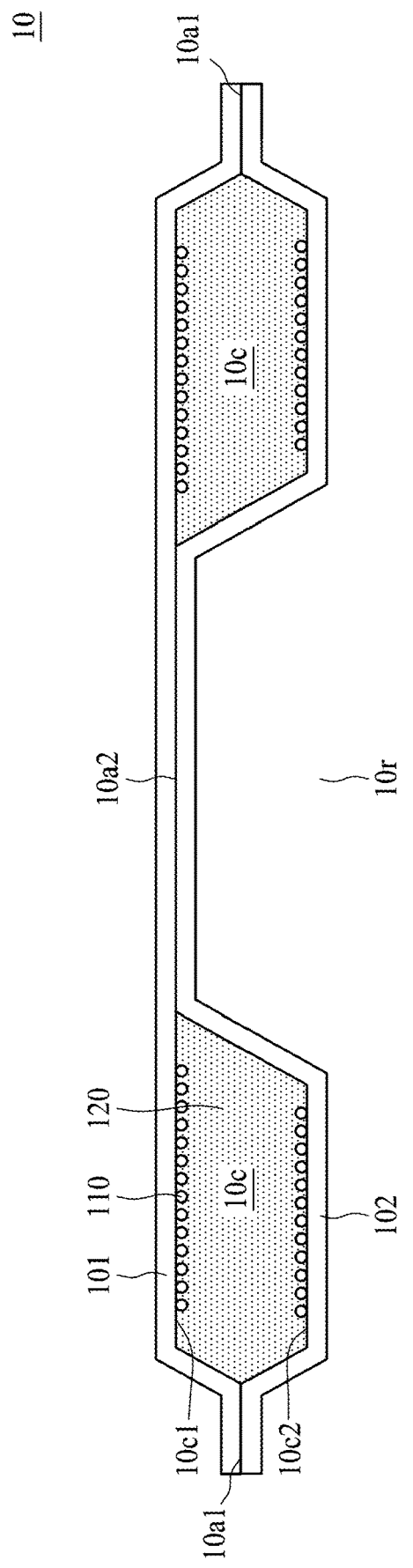
FIG. 1 is a cross-sectional view of a thermal conductive device in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a cross-sectional view of a thermal conductive device 10 in accordance with some embodiments of the present disclosure. In some embodiments, the thermal conductive device 10 is a vapor chamber. The thermal conductive device 10 includes conductive layers 101, 102, a plurality of wicks 110 and fluid 120.

The conductive layers 101 and 102 may include or be formed of materials having high thermal conductivity, such as tungsten, copper, aluminum, magnesium, nickel, gold, silver, aluminum oxide, beryllium oxide, or the like. In some embodiments, the conductive layers 101 and 102 are metal plates (e.g., copper plates). In some embodiments, the conductive layer 101 is connected or bonded to the conductive layer 102 to define a chamber 10c. For example, edges of the conductive layer 101 and the conductive layer 102 can be sealed to define a joint surface 10a1. For example, the edges of the conducive layer 101 contact the edges of the conductive layer 102. In some embodiments, a portion of the conductive layer 101 at or adjacent to the center of the conductive layer 101 and a portion of the conductive layer 102 at or adjacent to the center of the conductive layer 102 can be connected or bonded to each other to define a joint surface 10a2. For example, the portion of the conductive layer 101 contacts the portion of the conductive layer 102. As shown in FIG. 1, the chamber 10c surrounds the joint surface 10a2 to define a loop. The chamber 10c and the joint surface 10a2 may define a recess 10r. In some embodiments, a shape of the chamber 10c may be changed depending on different design specifications.

The wicks 110 are disposed within the chamber 10c. The wicks 110 are disposed on or adjacent to inner surfaces of the chamber 10c. As shown in FIG. 1, the wicks 110 are disposed on or adjacent to an upper surface 10c1 and a lower surface 10c2 of the chamber 10c. In other embodiments, the wicks 110 may be selectively disposed on or adjacent to the upper surface 10c1 or the lower surface 10c2 of the chamber 10c. In other embodiments, the wicks 110 may be further disposed on or adjacent to lateral surfaces extending between the upper surface 10c1 and the lower surface 10c2 of the chamber 10c. In some embodiments, the wicks 110 may be formed of or include sintered powder, mesh, grooves, or any combination thereof. In some embodiments, the wicks 110 may be formed on the inner surfaces of the chamber 10c by, for example, sintering, electroplating or any other suitable semiconductor manufacturing processes.

The fluid 120 (or working fluid) is disposed within the chamber 10c. The material of the fluid 120 is selected based on the temperature at which the thermal conductive device 10 may operate (e.g., the operating temperature). For example, the fluid 120 is selected so that the chamber 10c includes both vapor and liquid over the operating temperature range. In some embodiments, the fluid 120 may include, for example, water or an organic solution, such as ammonia, alcohol, ethanol or any other suitable materials.

In some embodiments, the fluid 120 is in the liquid state below the operating temperature. In other embodiments, the fluid 120 may be in both the liquid state and the gaseous state below the operating temperature depending on different design specifications. At or over the operating temperature, at least a portion of the fluid 120 vaporizes into gas or vapor. The vaporized gas travels from a location with a relative high temperature to another location with a relative low temperature, and then the gas would be cooled (or condensed) and turn into liquid (or saturated liquid) at the location with the relative low temperature. The saturated liquid may travel from the location with the relative low temperature to the location with the relative high temperature. In some embodiments, the liquid may flow along and adjacent to the wicks 110. In the case that the wicks 110 are disposed on or adjacent to both the upper surface 10c1 and the lower surface 10c2 of the chamber 10c, the liquid would travel along and adjacent to the upper surface 10c1 and the lower surface 10c2 in one direction, and the vapor would travel between the upper surface 10c1 and the lower surface 10c2 in an opposite direction. In the case that the wicks 110 are selectively disposed on or adjacent to the upper surface 10c1 of the chamber 10c, the liquid would travel along and adjacent to the upper surface 10c1 of the chamber 10c in one direction, and the vapor travels along and adjacent to the lower surface 10c2 of the chamber 10c in an opposite direction.

Figure 2:
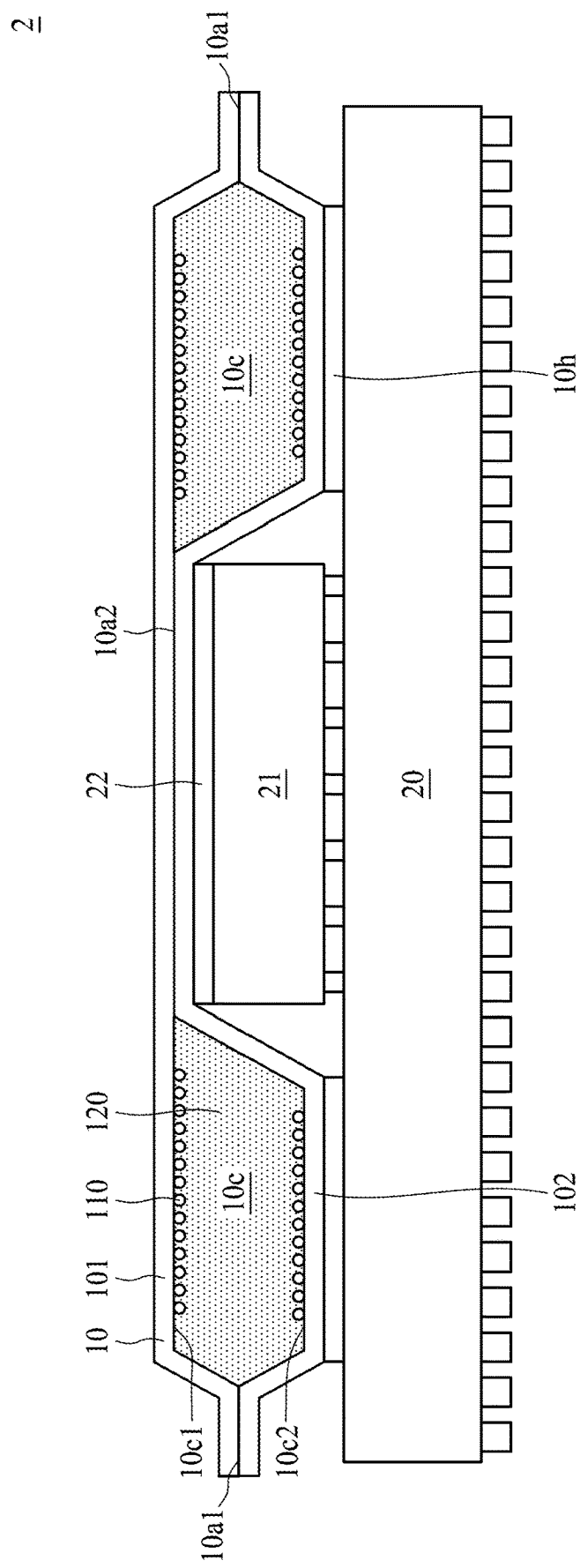
FIG. 2 is a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 includes a carrier, an electronic component 21, a thermal interface material (TIM) 22 and the thermal conductive device 10 as shown in FIG. 1.

The carrier 20 may be, for example, a printed circuit board, such as a paper-based copper foil laminate, a composite copper foil laminate, or a polymer-impregnated glass-fiber-based copper foil laminate. The carrier 20 may include an interconnection structure, such as a redistribution layer (RDL) or a grounding element. In some embodiments, the carrier 20 includes a ceramic material or a metal plate. In some embodiments, the carrier 20 may include a substrate, such as an organic substrate or a leadframe. In some embodiments, the carrier 20 may include a two-layer substrate which includes a core layer and a conductive material and/or structure disposed on an upper surface and a bottom surface of the carrier 20. The conductive material and/or structure may include a plurality of traces.

The electronic component 21 is disposed on the carrier 20. The electronic component 21 has an active surface and a back surface opposite to the active surface. The active surface of the electronic component 21 faces the carrier 20 and electrically connected to the carrier through electrical contacts (e.g., conductive bumps or copper pillars). The electronic component 21 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The TIM 22 is disposed on the back surface of the electronic component 21. In some embodiments, the TIM 24 contacts the back surface of the electronic component 21, which can provide enhanced heat dissipation for the electronic component 21. In some embodiments, the TIM 22 can be replaced by solder or other materials suitable for heat dissipation (e.g. thermally conductive materials, such as materials including a metal).

The thermal conductive device 10 is disposed on the TIM 22. In some embodiments, the joint surface 10a2 of the thermal conductive device 10 is disposed on the TIM 22. In some embodiments, an area of the joint surface 10a2 is equal to or greater than an area of the TIM 22 or the back surface of the electronic component 21. The conductive layer 102 of the thermal conductive device 10 contacts the TIM 22. The chamber 10c of the thermal conductive device 10 is disposed on the carrier 20 and surrounds the electronic component 21. The chamber 10c of the thermal conductive device 10 is attached to the carrier through an adhesion layer 10h (e.g., glue or tape). The recess 10r is used to accommodate the electronic component 21. In some embodiments, the thermal conductive device 10 may extend beyond lateral surfaces of the carrier 20. In some embodiments, a heat sink (not shown) may be disposed on the thermal conductive device 10 to form a thermal module.

In some embodiments, the thermal conductive device 10 may act as a heat flux transformer, cooling a high heat flux from the electronic component 21, and transforming it to a lower heat flux. For example, when the electronic component 21 is activated to operate, the heat generated by the electronic component 21 would transfer to the thermal conductive device 10 through the TIM 22. The temperature of a portion of the chamber 10c of the thermal conductive device 10 that is adjacent to the electronic component 21 increases to vaporize the fluid 120 within the chamber 10c and adjacent to the electronic component 21 into a gas or vapor. The vaporized gas travels from a location adjacent to the electronic component 21 to another location far away from the electronic component 21, and then the gas would be cooled (or condensed) and turn into the liquid (or saturated liquid) at the location far away from the electronic component 21. The saturated liquid may travel from the location far away from the electronic component 21 to the location adjacent to the electronic component 21. In some embodiments, the liquid may flow along and adjacent to the wicks 110 disposed on or adjacent to both the upper surface 10c1 and the lower surface 10c2 of the chamber 10c, and the vapor would travel between the upper surface 10c1 and the lower surface 10c2 of the chamber 10c.

In some existing semiconductor device packages, a copper heat spreader is disposed on the TIM to provide the heat dissipation for a chip. However, because the thermal conductivity K of copper is about 400 W/mK, the effective area for the heat dissipation of the heat spreader is just 1.06 times the area of the back surface of the chip, which is insufficient for the chip with a relatively high power. In accordance with the embodiments in FIG. 2, the thermal conductivity of the chamber 10c of the thermal conductive device 10 in the horizontal direction ($K_{xy}$) is about 4000 W/mk, and thus the effective area for the heat dissipation of the thermal conductive device 10 is about 1.67 times the area of the TIM 22 or the back surface of the electronic component 21, which would enhance the thermal dissipation of the electronic component 21 and increase the performance of the electronic component 21. In some embodiments, the effective area for the heat dissipation of the thermal conductive device 10 is 56% larger than that of the copper heat spreader.

In some embodiments, the conducive layers 101 and 102 of the thermal conductive device 10 over the TIM 22 and the electronic component 21 are not sealed. For example, the chamber 10c of the thermal conductive device 10 is disposed over the TIM 22 and the electronic component 21. However, the thermal conductivity of the chamber 10c of the thermal conductive device 10 in the vertical direction (Kz) is about 65 W/mk, which will hinder the heat dissipation in the vertical direction. In accordance with the embodiments in FIG. 2, the conducive layers 101 and 102 of the thermal conductive device 10 over the TIM 22 and the electronic component 21 are sealed (e.g., the joint surface 10a2 is disposed on the TIM 22), and the thermal conductivity of the joint surface 10a2 in the vertical direction is about 400 W/mK, which would have a better heat dissipation capability.

Figure 3:
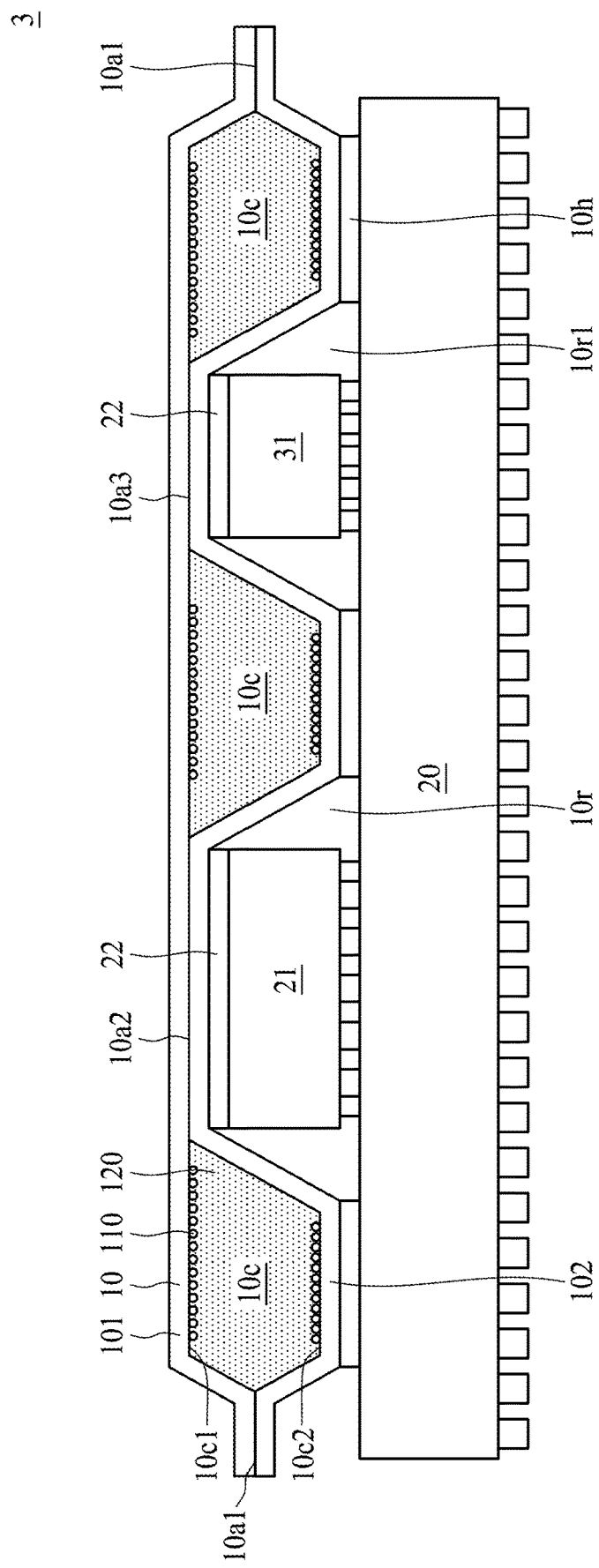
FIG. 3 is a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 2 in FIG. 2, and the difference therebetween are described below.

The semiconductor device package 3 further includes an electronic component 31 disposed on the carrier 20. The electronic component 31 may be the same as or different from the electronic component 21 depending on different design specifications. The conductive layer 101 and the conductive layer 102 are connected or sealed to define a joint surface 10a3 over the electronic component 31. The thermal conductive device 10 further includes a recess 10r1 to accommodate the electronic component 31. The recess 10r1 may be defined by the chamber 10c and the joint surface 10a3 above the electronic component 31. In some embodiments, the semiconductor device package 3 may include any number of electronic components, and the thermal conductive device 10 may include a plurality of joint surfaces over the corresponding electronic components. For example, the semiconductor device package 3 may include N electronic components, and the thermal conductive device 10 may include N joint surfaces over the corresponding electronic components, where N is an integer greater than 1.

Figure 4:
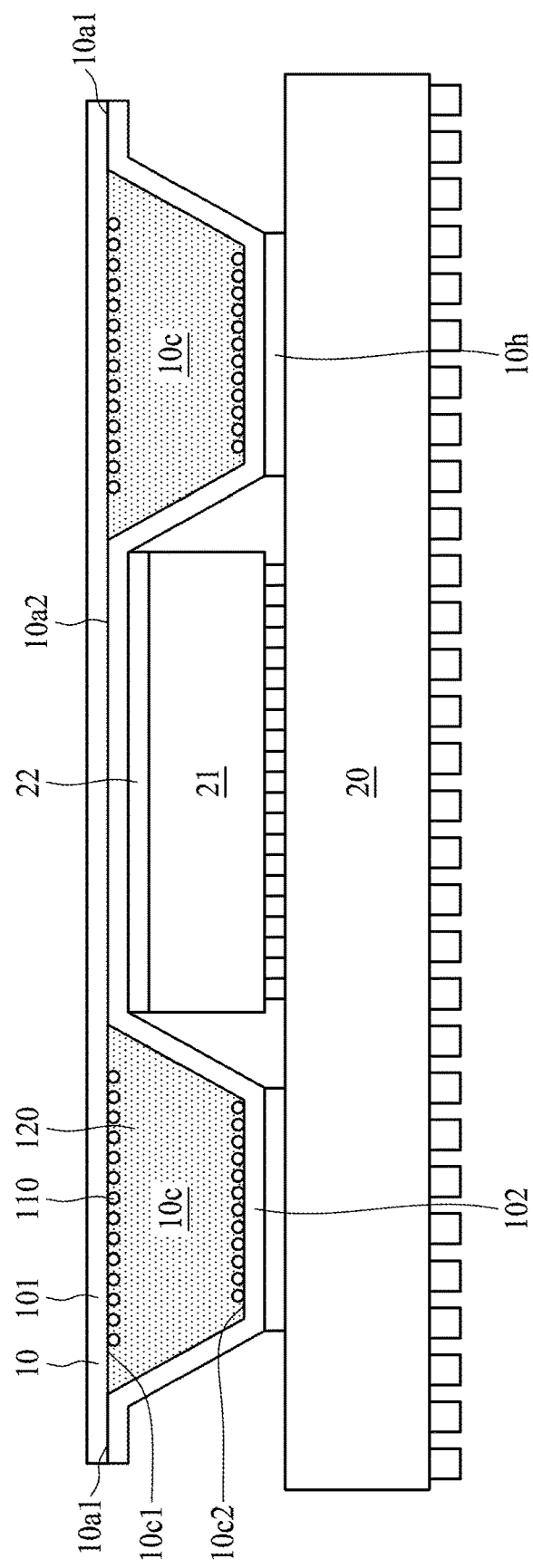
FIG. 4 is a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 2 in FIG. 2, and the difference therebetween are described below.

In FIG. 2, the joint surface 10a1 is lower than the joint surface 10a2. For example, a distance between the joint surface 10a1 and the carrier 20 is less than a distance between the joint surface 10a2 and the carrier 20. In FIG. 4, the joint surface 10a1 is substantially coplanar with the joint surface 10a2. For example, the distance between the joint surface 10a1 and the carrier 20 is substantially the same as the distance between the joint surface 10a2 and the carrier 20.

Figure 5:
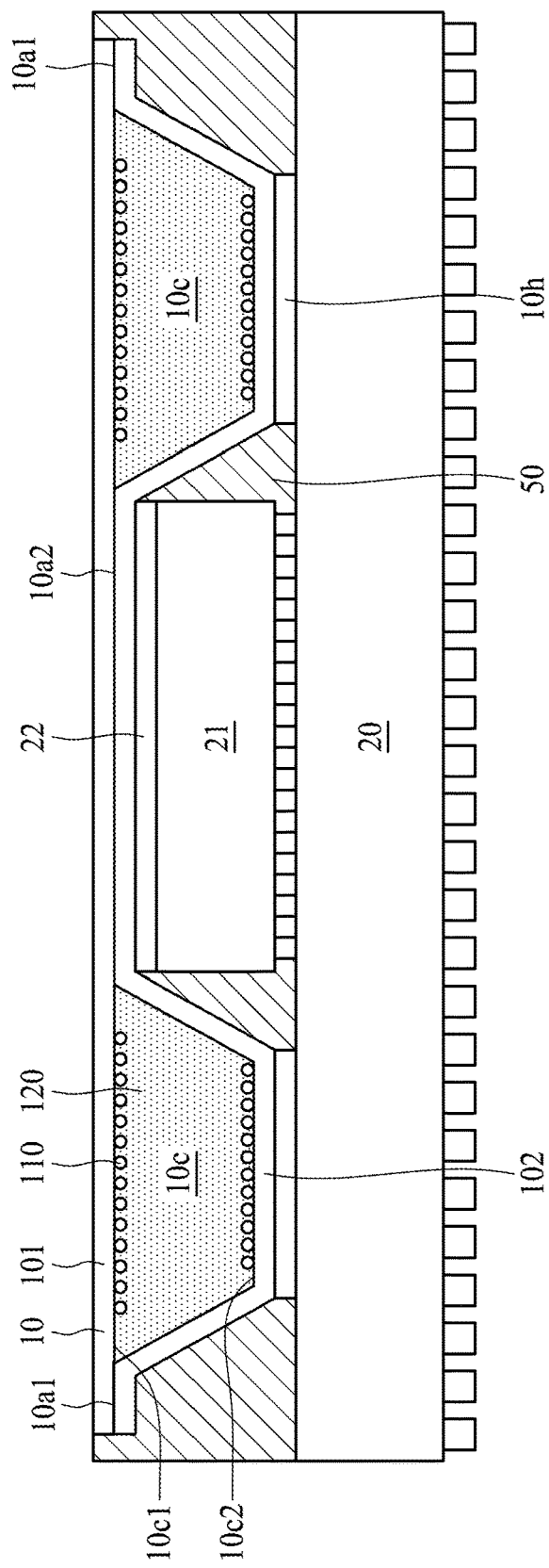
FIG. 5 is a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 2 in FIG. 2, and the difference therebetween are described below.

The semiconductor device package 5 further includes a package body 50 disposed on the carrier 20 to cover the electronic component 21. For example, the package body 50 is disposed within the recess 10r defined by the joint surface 10a2 and the chamber 10c. In some embodiments, the package body 50 includes, for example, one or more organic materials (e.g., a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

Figure 6:
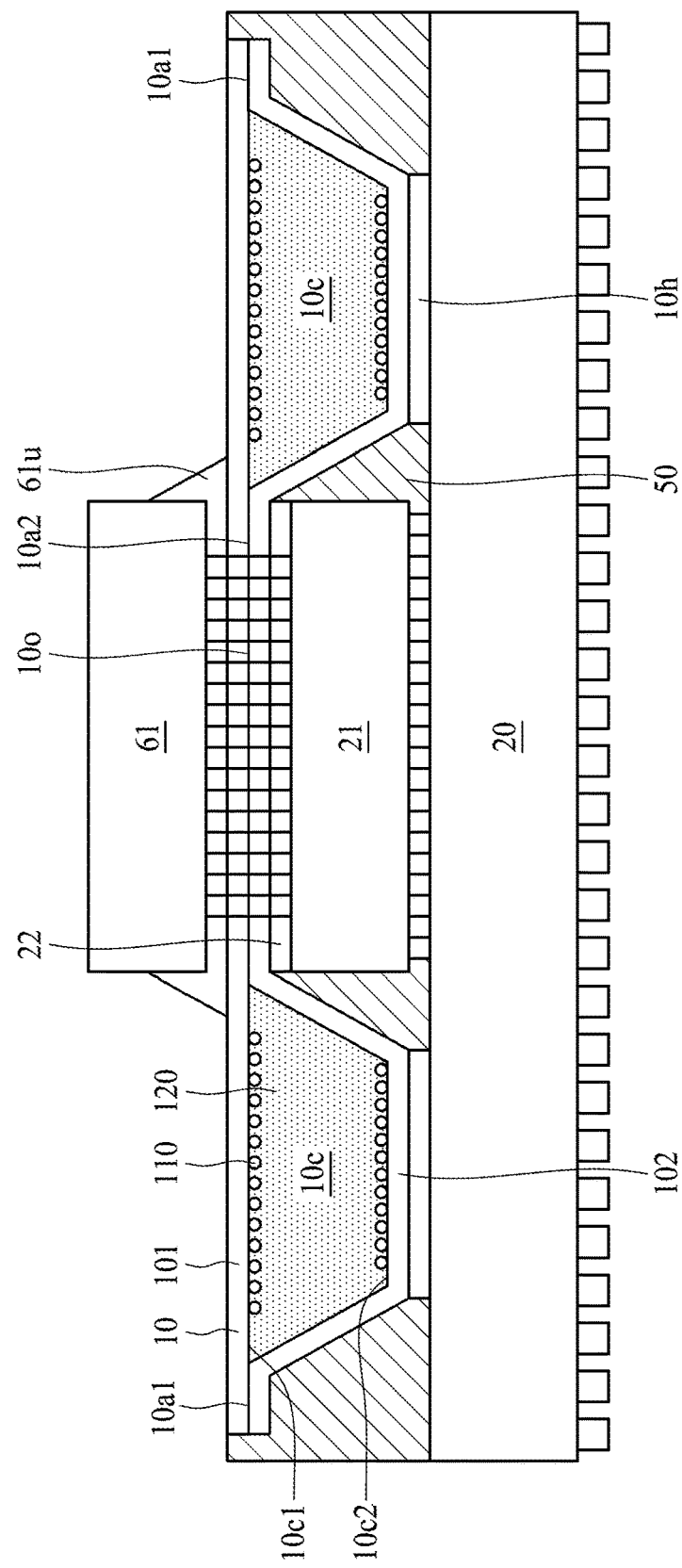
FIG. 6 is a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 is similar to the semiconductor device package 5 in FIG. 5, and the difference therebetween are described below.

The semiconductor device package 6 further includes an electronic component 61 disposed on the thermal conductive device 10. The electronic component 61 may be the same as or different from the electronic component 21 depending on different design specifications. In some embodiments, the joint surface 10a2 of the thermal conductive device 10 may include a plurality of openings 10o penetrating the joint surface 10a2. The electronic component 61 is electrically connected to the electronic component 21 through the openings. In some embodiments, an underfill 61u can be disposed between an active surface of the electronic component 61 and the thermal conductive device 10 to cover the active surface of the electronic component 61.

Figure 7:
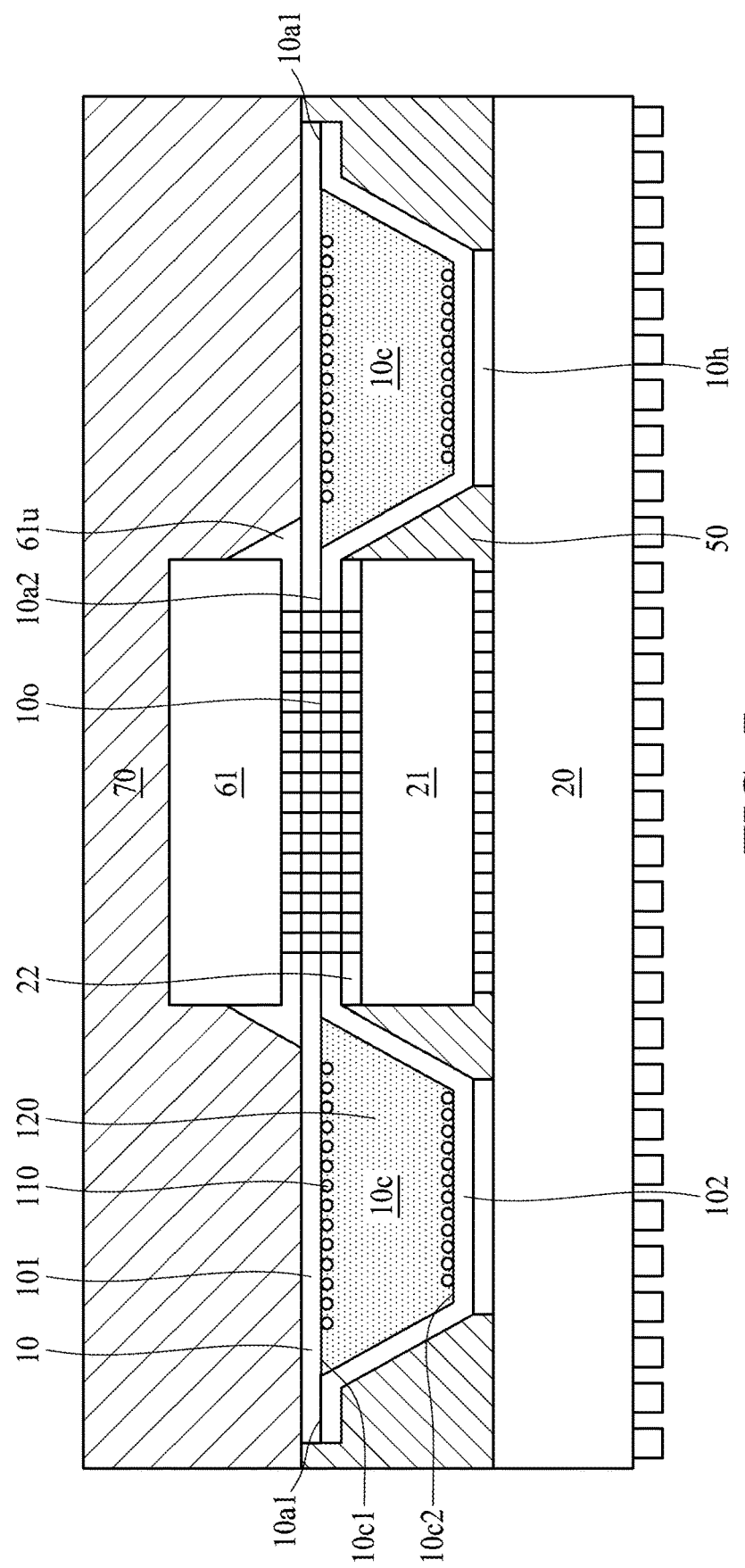
FIG. 7 is a cross-sectional view of a semiconductor device package in accordance with some embodiments of the present disclosure.

FIG. 7 illustrates a cross-sectional view of a semiconductor device package 7 in accordance with some embodiments of the present disclosure. The semiconductor device package 7 is similar to the semiconductor device package 6 in FIG. 6, and the difference therebetween are described below.

The semiconductor device package 7 further includes a package body 70 disposed on the thermal conductive device 10 to cover the electronic component 61 and the underfill 61u. In some embodiments, the package body 70 and the package body 50 may include the same material. Alternatively, the package body 70 and the package body 50 may include different materials.

Figure 8:
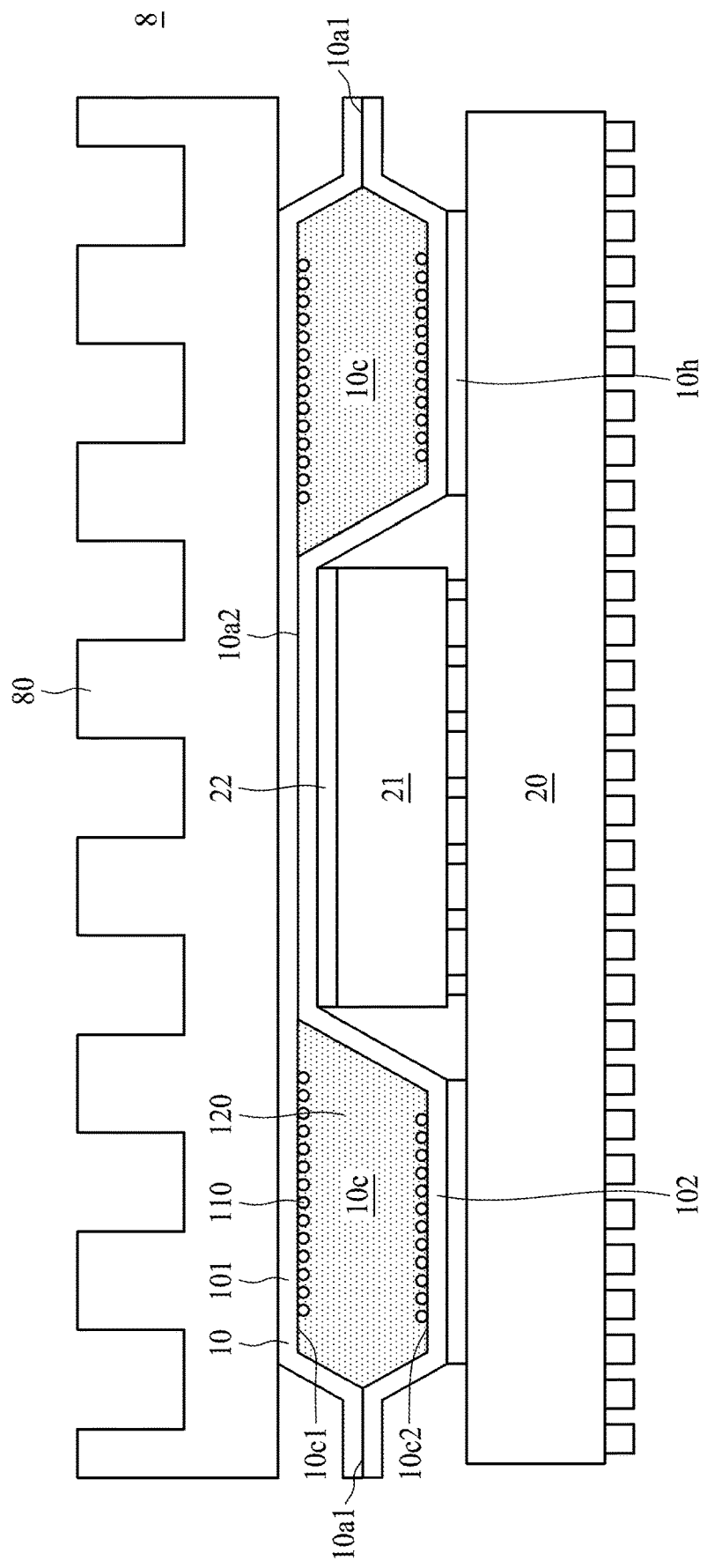
FIG. 8 is a cross-sectional view of a thermal module in accordance with some embodiments of the present disclosure.

FIG. 8 illustrates a cross-sectional view of a thermal module 8 in accordance with some embodiments of the present disclosure. The thermal module 8 includes the semiconductor device package as shown in FIG. 2 and a heat sink 80 disposed on the thermal conductive device 10. In some embodiments, the heat sink 80 may be disposed on the thermal conductive device 10 of any of the semiconductor device packages 2-6 illustrated in FIGS. 2-6 to form a thermal module.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A thermal conductive device, comprising:
a first conductive plate having a first portion adjacent to edges of the first conductive plate and a second portion far away from the edges;
a second conductive plate having a first portion adjacent to edges of the first conductive plate and a second portion far away from the edges, wherein the first portion and the second portion of the first conductive plate are respectively connected to the first portion and the second portion of the second conductive plate to define a chamber;
a plurality of wicks disposed within the chamber; and
a fluid disposed within the chamber,
wherein
the first conductive plate has a third portion between the first portion and the second portion;
the second conductive plate has a third portion between the first portion and the second portion; and
the third portion of the first conductive plate is spaced apart from the third portion of the second conductive plate.

2. The thermal conductive device of claim 1, wherein
the chamber has an upper surface and a lower surface opposite to the upper surface; and
the wicks are disposed adjacent to the upper surface and/or the lower surface of the chamber.

3. The thermal conductive device of claim 1, wherein
the second portion of the first conductive plate is connected to the second portion of the second conductive plate to define a joint surface; and
the chamber surrounds the joint surface.

4. The thermal conductive device of claim 3, wherein the joint surface and the chamber define a recess.

5. The thermal conductive device of claim 1, wherein the wicks include sintered powder, mesh, grooves, or any combination thereof.

6. The thermal conductive device of claim 1, wherein the fluid includes water or an organic solution.

7. A semiconductor device package, comprising:
a carrier;
a first electronic component disposed on the carrier, the first electronic component having an active surface facing the carrier and a back surface opposite to the active surface; and
a thermal conductive device having a first joint surface disposed on the back surface of the first electronic component and a chamber disposed on the carrier and surrounding the first electronic component,
wherein the thermal conductive device comprises a plurality of wicks disposed within the chamber and a fluid disposed within the chamber.

8. The semiconductor device package of claim 7, wherein the thermal conductive device comprises:
a first conductive plate having a first portion adjacent to edges of the first conductive plate and a second portion over the back surface of the first electronic component;
a second conductive plate having a first portion adjacent to edges of the first conductive plate and a second portion over the back surface of the first electronic component,
wherein the first portion and the second portion of the first conductive plate are respectively connected to the first portion and the second portion of the second conductive plate to define the chamber.

9. The semiconductor device package of claim 8, wherein the second portion of the first conductive plate is connected to the second portion of the second conductive plate to define the first joint surface; and
the first portion of the first conductive plate is connected to the first portion of the second conductive plate to define a second joint surface.

10. The semiconductor device package of claim 9, wherein a distance between the first joint surface and the carrier is larger than a distance between the second joint surface and the carrier.

11. The semiconductor device package of claim 9, wherein a distance between the first joint surface and the carrier is substantially the same as a distance between the second joint surface and the carrier.

12. The semiconductor device package of claim 8, wherein
the first conductive plate has a third portion between the first portion and the second portion;
the second conductive plate has a third portion between the first portion and the second portion; and
the third portion of the first conductive plate is spaced apart from the third portion of the second conductive plate.

13. The semiconductor device package of claim 7, wherein
the chamber has an upper surface and a lower surface opposite to the upper surface; and
the wicks are disposed adjacent to the upper surface and/or the lower surface of the chamber.

14. The semiconductor device package of claim 7, further comprising a thermal interface material disposed between the first joint surface of the thermal conductive device and the back surface of the first electronic component.

15. The semiconductor device package of claim 7, wherein the first joint surface and the chamber of the thermal conductive device define a recess to accommodate the first electronic component.

16. The semiconductor device package of claim 15, further comprising a first package body disposed within the recess and covering the first electronic component.

17. The semiconductor device package of claim 7, further comprising a second electronic component disposed on the first joint surface of the thermal conductive device, wherein the joint surface of the thermal conductive device has a plurality of openings, and the second electronic component is electrically connected to the first electronic component through the openings.

18. The semiconductor device package of claim 17, further comprises a second package body disposed on the thermal conductive device and covering the second electronic component.

19. The semiconductor device package of claim 7, further comprising a heat sink disposed on thermal conductive device.

20. A semiconductor device package, comprising:
a carrier;
an electronic component disposed on the carrier, the first electronic component having an active surface facing the carrier and a back surface opposite to the active surface;
a thermal conductive device having a first joint surface disposed on the back surface of the electronic component and a chamber disposed on the carrier and surrounding the electronic component; and
a fluid and gas vaporized from at least a portion of the fluid disposed within the chamber, wherein
the thermal conductive device comprises a plurality of wicks disposed within the chamber.

21. The semiconductor device package of claim 20, wherein the gas flows from a first portion of the chamber adjacent to the electronic component to a second portion of the chamber far away from the electronic component.

22. The semiconductor device package of claim 21, the gas condenses into liquid at the second portion of the chamber, and the liquid flows from the second portion of the chamber to the first portion of the chamber.

23. The semiconductor device package of claim 22, wherein the liquid flows along the wicks and adjacent to the wicks.

24. The semiconductor device package of claim 22, wherein the gas flows far away from the wicks.

25. The semiconductor device package of claim 20, wherein an effective area for the heat dissipation of the thermal conductive device is about 1.67 times an area of the back surface of the electronic component.

* * * * *